United States Patent
Namiki et al.

(10) Patent No.: US 8,612,191 B2
(45) Date of Patent: Dec. 17, 2013

(54) METHOD OF GENERATING TWO-WHEELED VEHICLE DUMMY MODEL AND APPARATUS FOR PERFORMING A COLLISION SIMULATION OF A TWO-WHEELED VEHICLE

(75) Inventors: Hideo Namiki, Wako (JP); Toyokazu Nakamura, Wako (JP)

(73) Assignee: Honda Motor Co., Ltd., Tokyo (JP)

(*) Notice: Subject to any disclaimer, the term of this patent is extended or adjusted under 35 U.S.C. 154(b) by 1539 days.

(21) Appl. No.: 11/811,492

(22) Filed: Jun. 11, 2007

(65) Prior Publication Data
US 2007/0244679 A1  Oct. 18, 2007

Related U.S. Application Data

(62) Division of application No. 10/918,102, filed on Aug. 13, 2004, now abandoned.

(30) Foreign Application Priority Data

Sep. 3, 2003 (JP) .................... 2003-311260
Sep. 3, 2003 (JP) .................... 2003-311261

(51) Int. Cl.
G06G 7/48 (2006.01)
G06F 17/00 (2006.01)
G06T 15/00 (2011.01)
G09G 5/00 (2006.01)

(52) U.S. Cl.
USPC ............ 703/8; 703/7; 345/418; 345/419; 345/583

(58) Field of Classification Search
USPC .................. 703/7, 8; 345/418, 583, 419
See application file for complete search history.

(56) References Cited

U.S. PATENT DOCUMENTS

| | | | |
|---|---|---|---|
| 5,018,977 A * | 5/1991 | Wiley et al. | 434/274 |
| 5,712,964 A * | 1/1998 | Kamada et al. | 345/418 |
| 2002/0151999 A1* | 10/2002 | Wu et al. | 700/95 |
| 2003/0001843 A1* | 1/2003 | Suzuki et al. | 345/426 |

FOREIGN PATENT DOCUMENTS

| | | |
|---|---|---|
| GB | 2 244 843 A | 12/1991 |
| JP | 7-98772 | 4/1995 |

OTHER PUBLICATIONS

S. Mukherjee, A. Chawla, D. Mohan, M. Singh, M. Sakurai and Y. Tamura. 2001, "Motorcycle-Car Side Impact Simulation", IRCOBI Proceedings, Oct. 2001, pp. 133-141.*
Curran, Chris, Virtual Crash Test Dummy Makes Major "Impact" on Highway Safety, Jan. 11, 2000, University of Cincinnati News Release.

* cited by examiner

*Primary Examiner* — Omar F Fernandez Rivas
*Assistant Examiner* — Nithya J Moll
(74) *Attorney, Agent, or Firm* — Hamre, Schumann, Mueller & Larson, P.C.

(57) ABSTRACT

A method of and an apparatus for performing a collision simulation on a two-wheeled vehicle using a virtual model of a dummy developed for use on four-wheeled vehicles.

3 Claims, 6 Drawing Sheets

ELEMENTS DEFORMED

ELEMENTS DELETED

METHOD OF GENERATING TWO-WHEELED VEHICLE DUMMY MODEL AND APPARATUS FOR PERFORMING A COLLISION SIMULATION OF A TWO-WHEELED VEHICLE This application is a divisional of application Ser. No. 10/918,102, filed Aug. 13, 2004 now abandoned.

FIELD OF THE INVENTION

The present invention relates to a method of generating a two-wheeled vehicle dummy and an apparatus for performing a collision simulation on a two-wheeled vehicle. More particularly, the invention relates to a method of and an apparatus for performing a collision simulation of a two-wheeled vehicle using an FEM (Finite Element Method) model of a dummy that is developed for use on four-wheeled vehicles in a virtual three-dimensional space constructed on a computer.

BACKGROUND OF THE INVENTION

There have been known collision simulation tests where a vehicle carrying a dummy simulating a passenger is actually driven into collision with an obstacle and damage caused to the vehicle and the passenger is evaluated. However, collision tests that employ actual vehicles and dummies are expensive and require a long preparatory period because the vehicle is destroyed and the dummy is damaged in each test. If a collision is simulated in a virtual three-dimensional space constructed on a computer using three-dimensional virtual models of a vehicle and a dummy, then the expenses and the preparatory period of such a collision simulation are greatly reduced.

When an impact is imparted to a virtual model of a vehicle and a virtual model of a dummy and their behaviors are analyzed on an impact/structure analyzing software program developed for analyzing a nonlinear phenomenon, problems arise in that parts which should collide with each other may move through each other or a part which will not actually be dented in may be dented in.

To solve the above problems and realize a simulation close to an actual collision, a conventional simulation apparatus performs a pre-processing operation called "collision definition" as disclosed in Japanese Patent Laid-open No. Hei 7-98772. According to the collision definition, conditions such as the hardnesses and materials of parts that are contacted upon a collision are preset, and the behaviors upon the collisions are simulated based on these conditions.

The conventional dummy described above is a virtual model of the dummy and has been developed for collision simulations for four-wheeled vehicles. Therefore, problems arise if the conventional dummy for a four-wheeled vehicle is applied directly to two-wheeled vehicles.

Specifically, as shown in FIG. 3, the conventional dummy has openings at upper arm ends 21, thigh joints 22, and a neck end 23 for keeping movable ranges of joints. Since there is no possibility for parts to contact those openings in collision simulations for four-wheeled vehicles, accurate results are obtained when those collision simulations are performed while ignoring such openings.

In collision simulations for two-wheeled vehicles, however, since the behavior of the rider differs widely from that of passengers on four-wheeled vehicles, as the rider may be thrown onto the road, parts may possibly contact the openings 21, 22, 23. On virtual models of conventional four-wheeled dummies, contact conditions cannot be defined for those regions because no face data are present in the above openings. Consequently, even when parts enter the openings in a collision simulation, no interference occurs therebetween, and they move through each other or are dented in. As a result, the behavior may not be converged and the simulation may be stopped, or even when simulation results are obtained, they may not be reliable enough.

Further, as shown in FIG. 10, a dummy model for four-wheeled vehicles has a reference posture with closed legs having both thighs 71R, 71L closed and knees bent at an obtuse angle.

However, two-wheeled vehicles require a normal riding posture with open legs having both thighs 71R, 71L sandwiching a fuel tank and knees bent at a sharp angle. Therefore, a dummy model for two-wheeled vehicles is needed to take a posture having both thighs spread, as shown in FIG. 11. If the dummy model for four-wheeled vehicles shown in FIG. 10 has its thighs 71R, 71L spread, then their attached ends kept in interference with the attached ends of the hip. Since the simulation apparatus is unable to perform normal calculations if contacting elements are present from the outset, the simulation apparatus fails to produce simulation results.

Spots of interference that occur when a four-wheeled vehicle dummy model takes a riding posture on a two-wheeled vehicle are not limited to the thighs and hip, but are present everywhere on the body, e.g., the thighs and lower thighs, the lower thighs and ankles, etc.

It is an object of the present invention to solve the conventional problems described above, and to provide a method of and an apparatus for performing a collision simulation on a two-wheeled vehicle using a virtual model of a dummy developed for use on four-wheeled vehicles. It is a further object to provide a method of generating a dummy model for two-wheeled vehicles based on a dummy model developed for use on four-wheeled vehicles.

SUMMARY OF THE INVENTION

In accordance with the present invention, a collision simulation apparatus for performing a collision simulation of a two-wheeled vehicle dummy model in a virtual three-dimensional space constructed on a computer using a virtual model of a dummy for use on four-wheeled vehicles comprising:
memory means for storing a dummy model simulating a dummy;
means of generating shell elements covering openings of the dummy;
means for generating a dummy model for two-wheeled vehicles by combining the openings of the dummy with said shell elements;
means for setting various test conditions including a contact condition for an FEM model of the dummy model for two-wheeled vehicles; and
means for performing a collision simulation on said FEM model for two-wheeled vehicles.

According to the above features, since the openings of the dummy are combined with shell elements, if a contact condition is set for them, then parts tending to enter the openings are brought into interference with the shell elements, and are prevented from moving through the openings or from being dented in.

In another embodiment, a method of generating a two-wheeled vehicle dummy model as a two-wheeled vehicle FEM model based on an FEM model of a four-wheeled vehicle dummy comprising the steps of extracting regions of mutual interference caused when the FEM model of the four-wheeled vehicle dummy takes a riding posture on a two-wheeled vehicle, and correcting elements of said regions of mutual interference so as to avoid said interference.

No contact definition is produced and no contact is recognized with respect to elements of the regions of mutual interference caused when the FEM model takes a riding posture on a two-wheeled vehicle. Therefore, the simulation can be continued irrespective of whether there is an interference or not.

In another embodiment, the method comprises the steps of extracting regions of mutual interference caused when the FEM model of the four-wheeled vehicle dummy takes a riding posture on a two-wheeled vehicle, and producing a contact definition with respect to elements which cause mutual contact while a simulation is being performed wherein no contact definition is produced with respect to elements of said regions of mutual interference.

Elements of the regions of mutual interference caused when the FEM model takes a riding posture on a two-wheeled vehicle are corrected to avoid the interference, the FEM model for use on the four-wheeled vehicle can be used as an FEM model for use on two-wheeled vehicles.

A virtual model of a dummy that has been developed for use on four-wheeled vehicles and cannot take a riding posture on two-wheeled vehicles can ride on a virtual model of a two-wheeled vehicle in a virtual three-dimensional space constructed on a computer. Therefore, a collision simulation for two-wheeled vehicles can be performed using an FEM model of a dummy developed for use on four-wheeled vehicles.

DETAILED DESCRIPTION OF THE INVENTION

Figure 1:
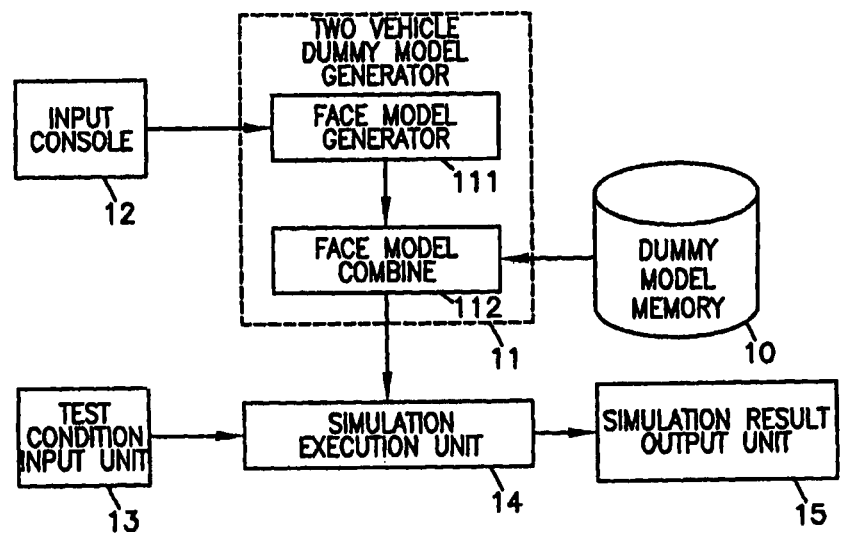
FIG. 1 is a block diagram of a main section of a collision simulation apparatus for two-wheeled vehicles according to the present invention.

FIG. 1 is a block diagram of a main section of a collision simulation apparatus for two-wheeled vehicles according to the present invention.

A dummy model memory 10 stores, in advance, data (dummy data) of a virtual three-dimensional model which is an exact simulation of a dummy developed for a collision simulation for four-wheeled vehicles, as an FEM model divided into a mesh structure. A two-wheeled vehicle dummy model generator 11 includes a face data generator 111 and a face data combiner 112, and generates a dummy model for two-wheeled vehicles which has major openings covered with shell elements based on inputs detected by an input console 12 and a dummy model for four-wheeled vehicles.

A test condition input unit 13 enters various conditions to be preset for performing a collision simulation. A simulation execution unit 14 performs a collision simulation on the dummy model for two-wheeled vehicles based on the input test conditions. A simulation result output unit 15 outputs the results of the collision simulation.

Figure 2:
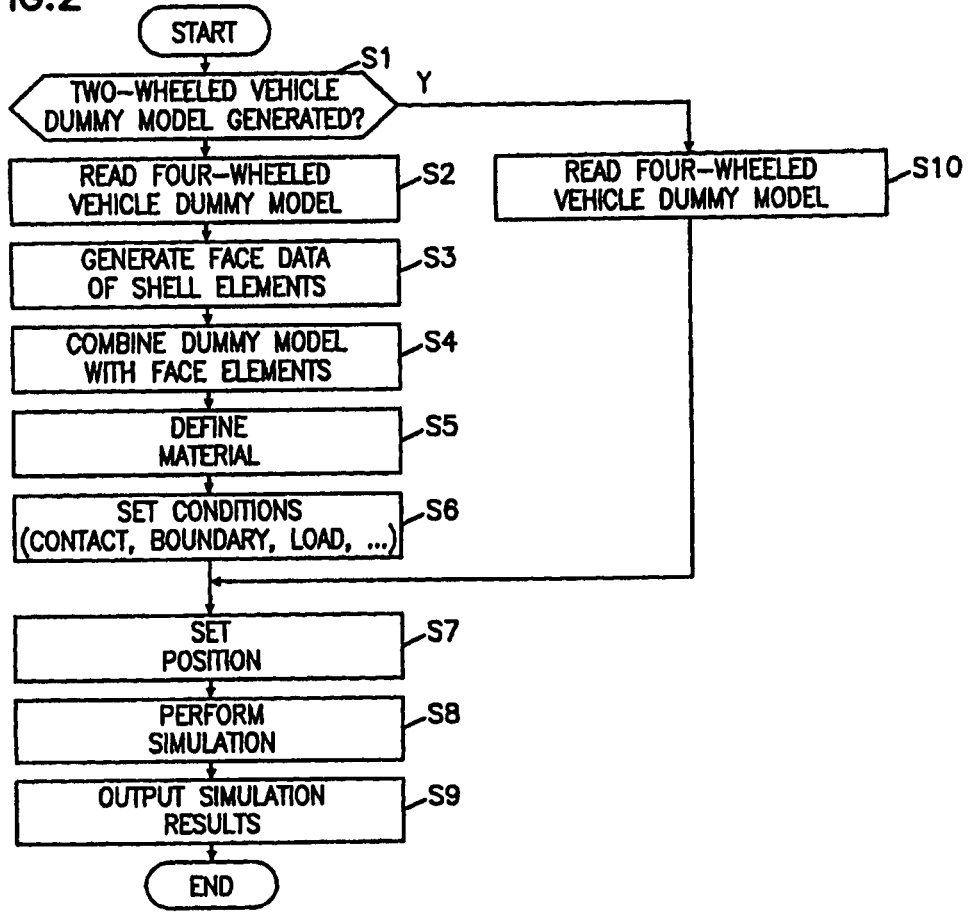
FIG. 2 is a flowchart of an operation sequence of the collision simulation apparatus for two-wheeled vehicles according to the present invention.

Operation of the collision simulation apparatus for two-wheeled vehicles described above will be described below with reference to a flowchart shown in FIG. 2.

In step S1, it is determined whether an FEM model of a two-wheeled vehicle dummy for use in a collision simulation is already stored in the dummy model memory 10 or not. Since no such FEM model is initially stored in the dummy model memory 10, control goes to step S2. In step S2, the FEM model of a four-wheeled vehicle dummy is read from the dummy model memory 10. On the FEM model, regions which are expected to be deformed are divided into a finer mesh pattern, and other regions are divided into a coarser mesh pattern.

Figure 3:
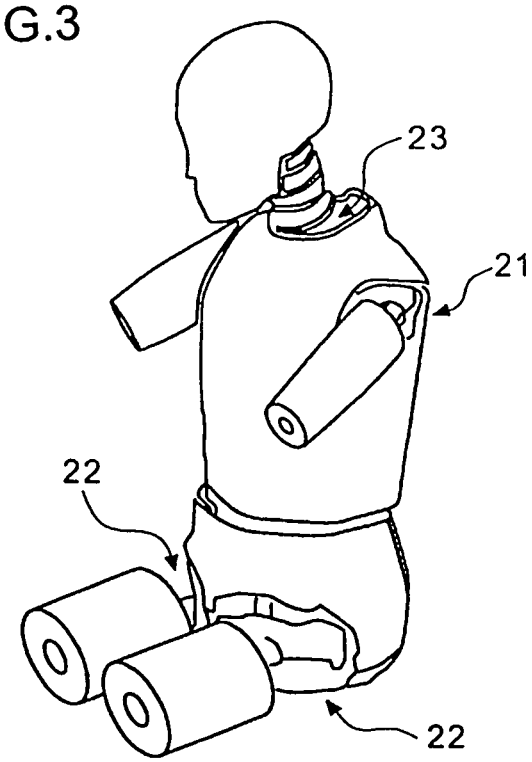
FIG. 3 is a view showing a conventional dummy model for four-wheeled vehicles by way of example.

FIG. 3 shows a three-dimensional graphic image representing an example of the dummy model. The dummy model has openings at upper arm ends 21, thigh joints 22, and a neck end 23. An actual model has openings at joints other than the above three regions. However, only those three regions will be described below.

In step S3, face data of shell elements covering the openings of the dummy model are generated by the face data generator 111 based on data entered from the input console 12. In step S4, the face data of the shell elements are divided into finite elements in conformity with nodes formed in the openings of the FEM model for four-wheeled vehicles by the face data combiner 112. Specifically, the face data of the shell elements are divided into finite elements so as to share nodes with the FEM model for four-wheeled vehicles in the openings which are combined with the shell elements. Then, an FEM model of the shell elements is combined with the openings of the FEM model for four-wheeled vehicles, thus generating a dummy model for two-wheeled vehicles where the openings 21, 22, 23 are covered with shell elements 31, 32, 33.

Figure 4:
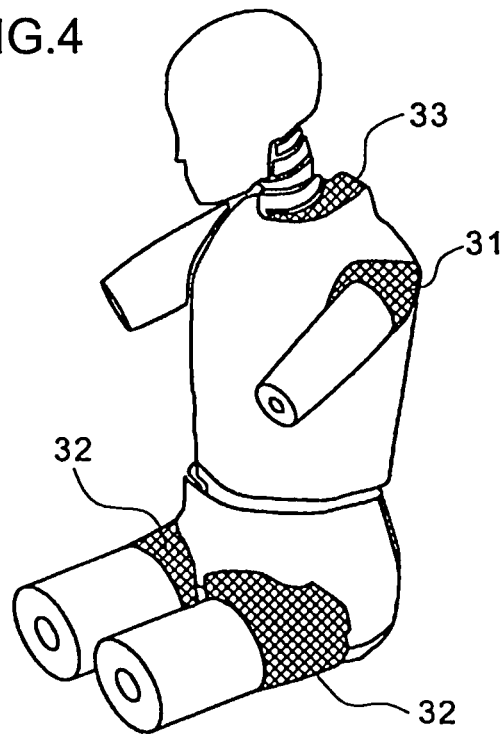
FIG. 4 is a view showing a conventional dummy model for two-wheeled vehicles by way of example.

FIG. 4 shows a three-dimensional graphic image representing an example of the dummy model for two-wheeled vehicles. A comparison of the dummy model for two-wheeled vehicles with the dummy model for four-wheeled vehicles show in FIG. 3 indicates that the openings 21, 22, 23 are covered with shell elements 31, 32, 33.

In step S5, the material of the model is defined. In step S6, test conditions such as for contact, boundary, load, etc. are set for various parts of the dummy model including the added shell elements, and are stored as an FEM model of a dummy for two-wheeled vehicles in the dummy model memory 10. In next and subsequent cycles, therefore, control goes from step S1 to step S10 in which the FEM model of the dummy for two-wheeled vehicles is read from the dummy model memory 10.

In step S7, a postural position of the FEM model is set depending on the riding posture for two-wheeled vehicles. In step S8, an impact/structure analyzing software program is activated to perform a simulation. In step S9, the results of the simulation are output from the simulation result output unit 15.

Figure 5:
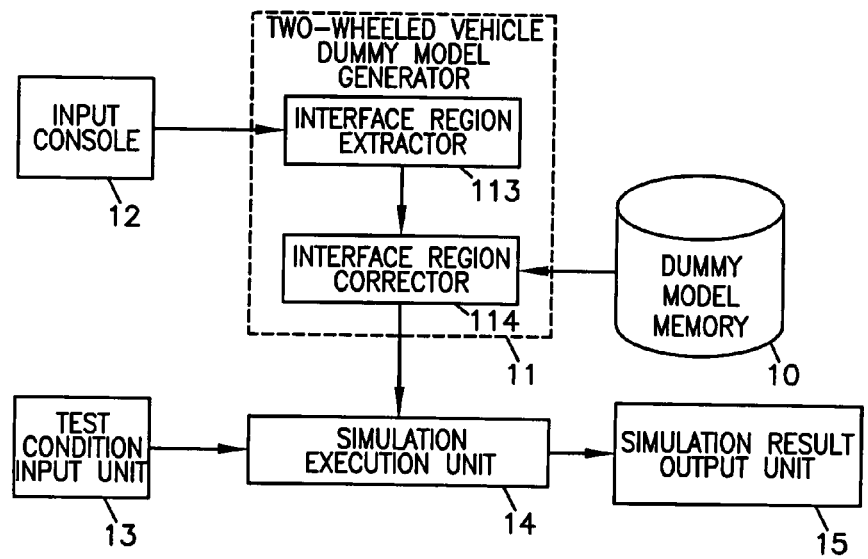
FIG. 5 is a block diagram of a main section of a collision simulation apparatus for two-wheeled vehicles according to the present invention.

Another embodiment of the present invention will be described below with reference to the drawings. FIG. 5 is a block diagram of a main section of a collision simulation apparatus for two-wheeled vehicles according to the another embodiment.

A dummy model memory 10 stores, in advance, data (dummy data) of a virtual three-dimensional model which is an exact simulation of a dummy developed for a collision simulation for four-wheeled vehicles, as an FEM model divided into a mesh structure. A two-wheeled vehicle dummy model generator 11 includes an interference region extractor 113 and an interference region corrector 114, and generates a dummy model for two-wheeled vehicles by correcting a dummy model for four-wheeled vehicles based on inputs detected by an input console 12.

A test condition input unit 13 enters various conditions to be preset for performing a collision simulation. A simulation execution unit 14 performs a collision simulation on the dummy model for two-wheeled vehicles based on the input test conditions. A simulation result output unit 15 outputs the results of the collision simulation.

Figure 6:
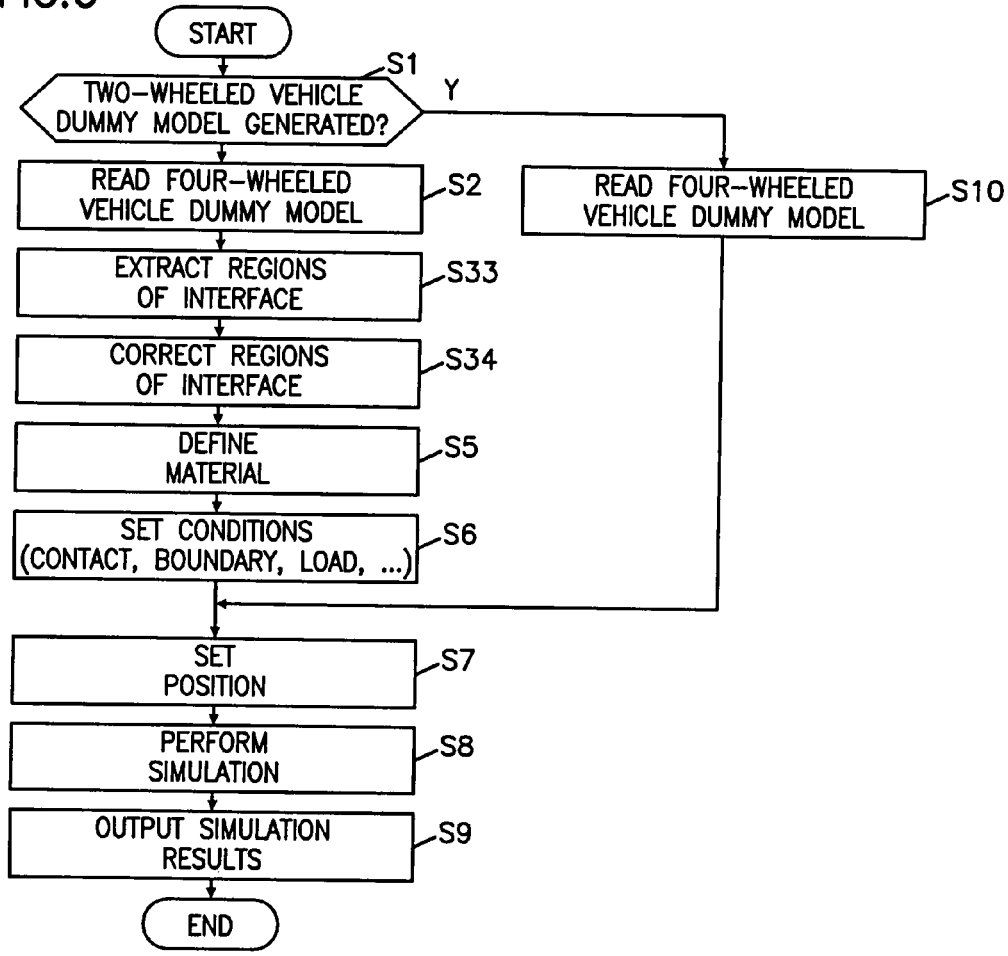
FIG. 6 is a flowchart of an operation sequence of the collision simulation apparatus for two-wheeled vehicles according to the present invention.

Operation of the collision simulation apparatus for two-wheeled vehicles described above will be described below with reference to a flowchart shown in FIG. 6.

In step S1, it is determined whether an FEM model of a two-wheeled vehicle dummy for use in a collision simulation is already stored in the dummy model memory 10 or not. Since no such FEM model is initially stored in the dummy model memory 10, control goes to step S2. In step S2, the FEM model of a four-wheeled vehicle dummy is read from the dummy model memory 10. On the FEM model, regions which are expected to be deformed are divided into a finer mesh pattern, and other regions are divided into a coarser mesh pattern.

Figure 7:
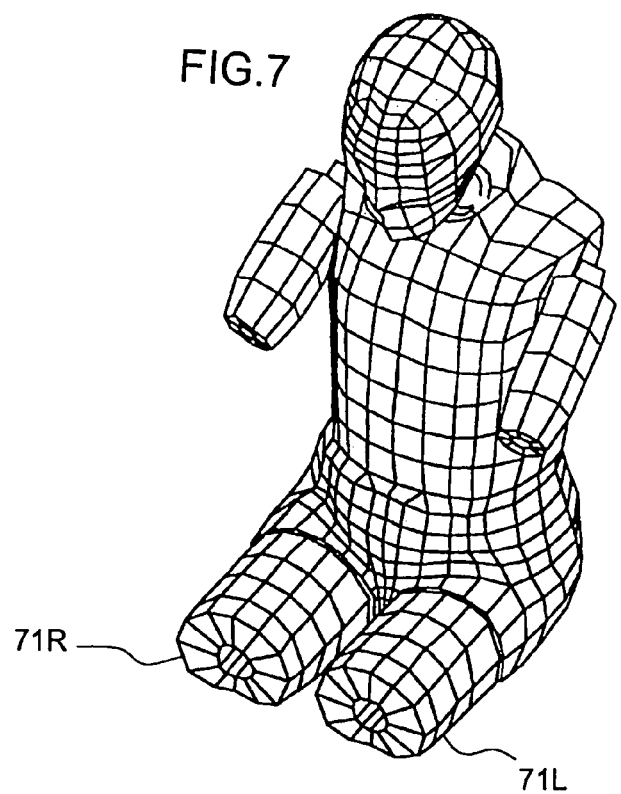
FIG. 7 is a view showing a basic posture of an FEM model for four-wheeled vehicles.
Figure 8:
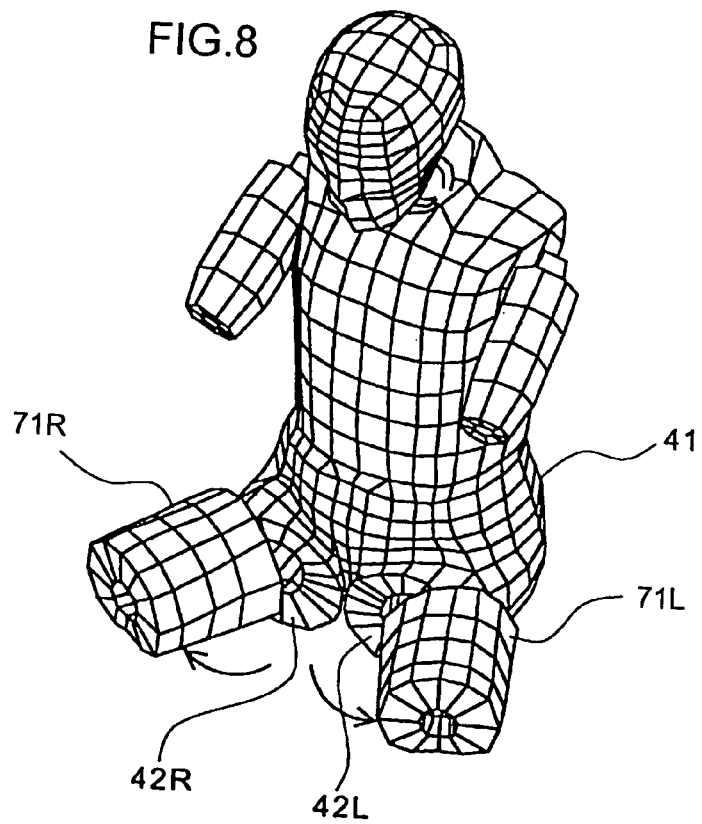
FIG. 8 is a view showing the FEM model as it takes a riding posture on two-wheeled vehicles.

In step S33, regions of mutual interference caused when the FEM model takes a riding posture on two-wheeled vehicles are extracted by the interference region extractor 113. For example, when an FEM model (only an essential section thereof shown) for use on four-wheeled vehicles as shown in FIG. 7 takes a riding posture on two-wheeled vehicles, since left and right thighs 71R, 71L are spread as shown in FIG. 8, the thighs 71R, 71L have attached end faces held in mutual interference with attached end faces 42R, 42L of a hip 41. The interference region extractor 113 extracts regions of mutual interference caused when the FEM model for four-wheeled vehicles takes a riding posture on two-wheeled vehicles. In step S44, elements of the extracted regions of mutual interference are corrected (deformed or deleted) by the interference region corrector 114 to avoid the mutual interference depending on a corrective action that is made by the operator and entered from the input console 12.

Figure 9A:
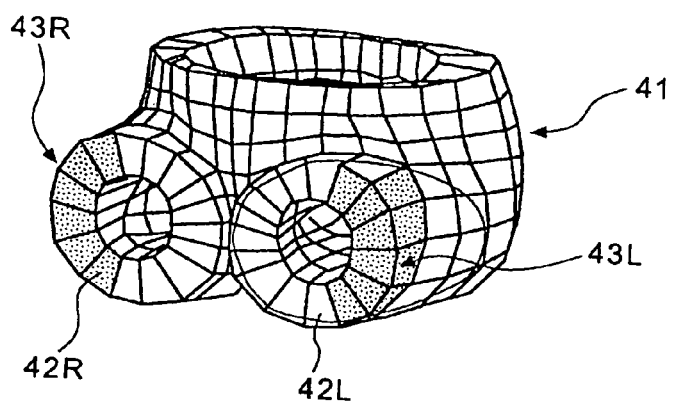
FIG. 9(a) is a view showing a process of correcting an FEM model for four-wheeled vehicles into an FEM model for two-wheeled vehicles.

FIG. 9(a) shows a configuration of the hip 41 of the FEM model for four-wheeled vehicles, with the attached end faces 42R, 42L being flat and oriented forward. When the thighs are spread laterally, outer sides 43L, 43R shown hatched are brought into interference with the thighs. According to the present invention, elements of the regions of mutual interference which is caused when the FEM model takes a riding posture on two-wheeled vehicles are corrected to avoid the mutual interference.

Figure 9B:
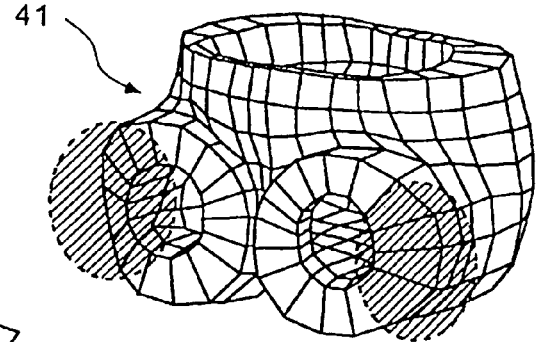
FIG. 9(b) is another view showing a process of correcting an FEM model for four-wheeled vehicles into an FEM model for two-wheeled vehicles.
Figure 9C:
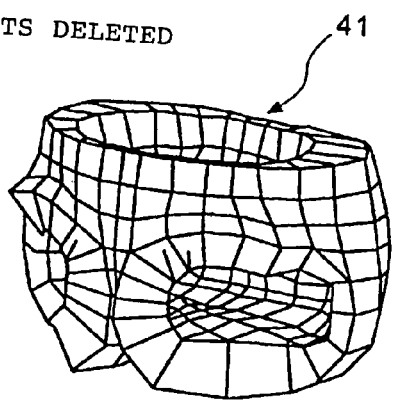
FIG. 9(c) is another view showing a process of correcting an FEM model for four-wheeled vehicles into an FEM model for two-wheeled vehicles.
Figure 10:
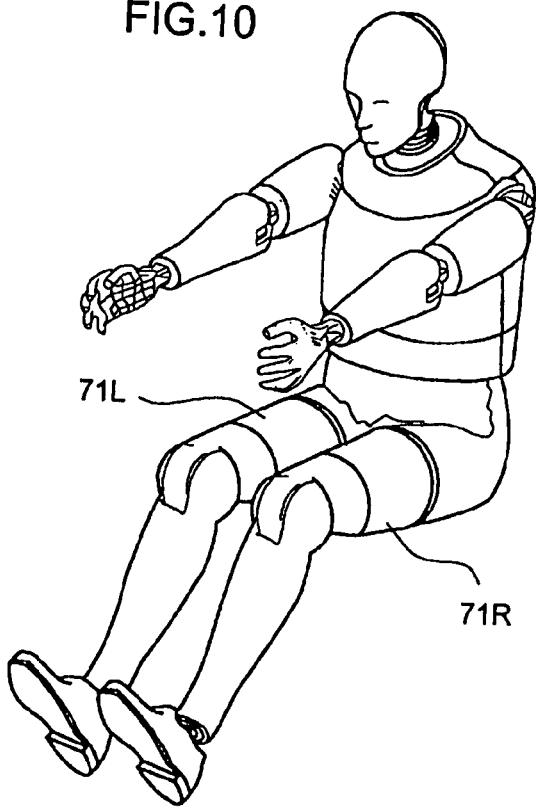
FIG. 10 is a view showing a dummy model as it takes a riding posture on four-wheeled vehicles.
Figure 11:
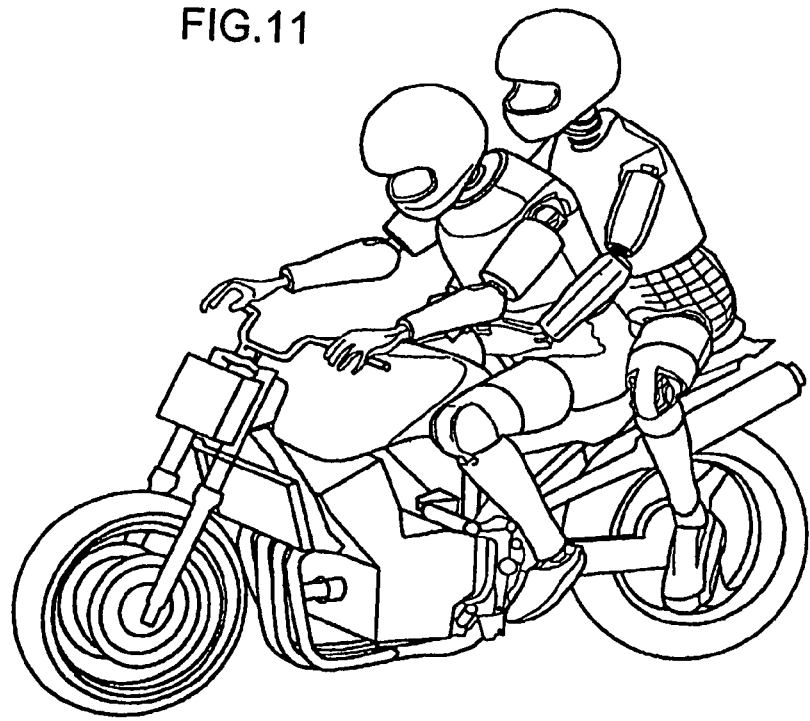
FIG. 11 is a view showing a dummy model as it takes a riding posture on two-wheeled vehicles.

More specifically, in FIG. 9(b), the elements of the outer sides shown hatched are deformed into thinner elements to keep a range in which the thighs are movable, thereby avoiding the mutual interference. In FIG. 9(c), all the elements of the attached ends of the hip 41 are deleted to avoid the mutual interference. The deformed regions or the deleted regions are divided into a mesh structure, as required.

In step S5, the material of the model is defined. In step S6, test conditions such as for contact, boundary, load, etc. are set for various parts of the FEM model, and are stored as an FEM model of a dummy for two-wheeled vehicles in the dummy model memory 10. In next and subsequent cycles, therefore, control goes from step S1 to step S10 in which the FEM model of the dummy for two-wheeled vehicles is read from the dummy model memory 10.

In step S7, a postural position of the FEM model is set depending on the riding posture for two-wheeled vehicles. In step S8, an impact/structure analyzing software program is activated to perform a simulation. In step S9, the results of the simulation are output from the simulation result output unit 15.

In the above embodiment, the elements of the regions of mutual interference of the dummy model for four-wheeled vehicles are deformed or deleted to eliminate an interference. With respect to interfering elements, no contact definition may be carried out. Interfering elements may be allowed to "enter each other" or "move through each other" to permit the dummy model to take a riding posture on two-wheeled vehicles.

Although embodiments of the present invention have been described thus far, the present invention is not limited to the examples in the drawings and the embodiments described above, and various modification may be made without departing the scope of the present invention, as a matter of course.

We claim:

1. A method of generating a two-wheeled vehicle dummy model as a two-wheeled vehicle FEM model based on an FEM model of a four-wheeled vehicle Dummy, comprising:
   extracting regions of mutual interference among body elements of said dummy model which is caused when the FEM model of the four-wheeled vehicle dummy takes a riding posture on a two-wheeled vehicle; and
   correcting the body elements of said dummy model in said regions of mutual interference by changing said body elements so as to avoid said interference.

2. The method of generating a two-wheeled vehicle dummy model according to claim 1 wherein the elements of the regions of mutual interference are deleted in said correcting step.

3. The method of generating a two-wheeled vehicle dummy model according to claim 1, wherein that the elements of the regions of mutual interference are deformed in said correcting step.

* * * * *